United States Patent [19]

Moore et al.

[11] 4,037,174

[45] July 19, 1977

[54] COMBINED ACOUSTIC SURFACE WAVE AND SEMICONDUCTOR DEVICE PARTICULARLY SUITED FOR SIGNAL CONVOLUTION

[75] Inventors: Robert A. Moore, Arnold; Herbert Warren Cooper, Hyattsville, both of Md.

[73] Assignee: Westinghouse Electric Corporation, Pittsburgh, Pa.

[21] Appl. No.: 423,650

[22] Filed: Dec. 10, 1973

[51] Int. Cl.² ............ H03H 9/26; H03H 9/32; H03H 7/28; H03K 5/20
[52] U.S. Cl. ................ 333/30 R; 235/181; 307/317 A; 310/9.8; 333/70 T; 333/72
[58] Field of Search ......... 333/30 R, 72, 70 T; 235/181; 310/8, 8.2, 9.8; 357/15; 307/232, 317 A, 235 G

[56] References Cited

U.S. PATENT DOCUMENTS

| | | | |
|---|---|---|---|
| 3,479,572 | 11/1969 | Pokorny | 317/235 |
| 3,593,207 | 7/1971 | Woermbke | 333/84 M X |
| 3,621,482 | 12/1969 | Adler | 333/72 |
| 3,691,406 | 9/1972 | Mize | 317/235 G X |
| 3,903,406 | 9/1975 | London | 235/181 |

*Primary Examiner*—Eli Lieberman
*Assistant Examiner*—Marvin Nussbaum
*Attorney, Agent, or Firm*—R. M. Trepp

[57] ABSTRACT

The disclosure relates to a novel device for performing signal convolution functions such as auto and cross correlation through the use of combined acoustic surface wave and semiconductor devices. A detector or pickup unit comprising a plurality of interdigital fingers coupled to associate semiconductor diodes is disposed on the surface of an acoustic substrate in the path of surface waves propagated along the surface of the substrate. The diodes are operatively connected to a summing bus from which an output signal indicative of some characteristics of the surface waves may be obtained.

5 Claims, 8 Drawing Figures

COMBINED ACOUSTIC SURFACE WAVE AND SEMICONDUCTOR DEVICE PARTICULARLY SUITED FOR SIGNAL CONVOLUTION

BACKGROUND OF THE INVENTION

1. Field of the Invention

The present invention relates to surface wave acoustic devices and, more particularly, to a novel method and apparatus for performing correlation and related signal convolution functions through the use of combined surface wave acoustic techniques and semiconductor techniques.

2. State of the Prior Art

Signal correlation and related signal convolution functions as applied to various types of signals typically involve the detection of one or more particular characteristics of a signal or the combining of signals in such a way that a particular characteristic is reinforced or suppressed. For example, signal correlation may involve the examination of a signal for a predetermined code carried by the signal in the form of pulse spacing or repetition frequency and the generation of an appropriate response when the proper code is detected. This type of signal correlation may be accomplished through the comparison on two signals (e.g., cross correlation) or through self or auto correlation techniques involving the use of frequency sensitive filters or the like.

One known type of self or auto correlator referred to as a Barker code decoder employs surface wave acoustical devices to provide a filter which is matched precisely with the characteristics of the desired signal and rejects undesired signals. To decode a signal in this manner, a surface wave acoustic device having a pickup or output transducer appropriately matched to the characteristics of the desired signal is typically employed in conjunction with a substrate of acoustic material such as quartz. The result is that only these surface waves having the desired characteristics are detected and undesired signals are rejected.

The foregoing type of correlators may be utilized successfully in connection with the decoding of signals with unvarying characteristics. However, since the correlation function depends upon fixed filtering characteristics of the correlator, neither the correlating function nor the correlated signal may be altered. Cross and auto/cross correlation between two signals, in effect, is thus typically required where variations in the correlating characteristics are expected and/or desired.

Cross and auto/cross correlation, and related convolution functions require essentially three functions, that is, (1) storage of the two signals over the integration period in real time, (2) real time multiplication of the two signals and, (3) integration. An acoustic medium such as the substrate of a surface wave acoustic device can be used for one or more of these functions. Clearly, the acoustic medium is quite suitable for the storage function. Attempts have been made to use the acoustic medium for the multiplication function as well by taking advantage of the nonlinearity of the acoustic medium for correlation of traveling wave harmonic generation or conversion of closely related functions.

From an analysis of conversion efficiencies for correlation and traveling wave operations using an acoustic medium to perform the nonlinear multiplication function, it appears that the conversion loss for correlation is much greater than the conversion loss for traveling wave harmonic generation or for frequency conversion. The reason for the difference is that correlation must occur over a relatively short interaction distance equal to approximately the wavelength of the reciprocal bandwidth of the correlating signal whereas traveling wave harmonic generation and conversion have significant distances in which to build up. It is clear that the nonlinear properties of the acoustic medium can be utilized provided the interaction time is sufficiently great. However, for correlation of broadband signals this is impossible since the interaction time is essentially the reciprocal bandwidth.

OBJECTS AND SUMMARY OF THE INVENTION

It is accordingly an object of the present invention to provide a novel method and system for performing correlation and related convolution functions.

It is another object of the present invention to provide a novel combination of a surface wave acoustic device and semiconductor device particularly suited for signal correlation.

It is a more specific object of the present invention to provide a novel method and apparatus employing combined acoustic and semiconductor techniques to provide efficient signal correlation through the use of an acoustic medium for signal storage and semiconductor effects for both multiplication and integration or summation.

It is yet another object of the present invention to provide a novel surface wave acoustic device wherein two signals are sampled relative to each other through the use of surface wave acoustic techniques and are further processed through the use of semiconductor techniques.

These and other objects and advantages are accomplished in accordance with the present invention through the provision of a novel method and apparatus for the convolution of signals by combining acoustic surface wave and semiconductor techniques. Broadly, the invention includes a surface wave detecting means carried by an acoustic substrate for detecting surface waves propagated along the substrate at spaced locations and for providing output signals related to the detected surface waves.

Semiconductor means operatively connected to the surface wave detecting means arithmetically combine the output signals from the detecting means to thereby provide an output related to the combined detector output signals.

DETAILED DESCRIPTION

Figure 1A:
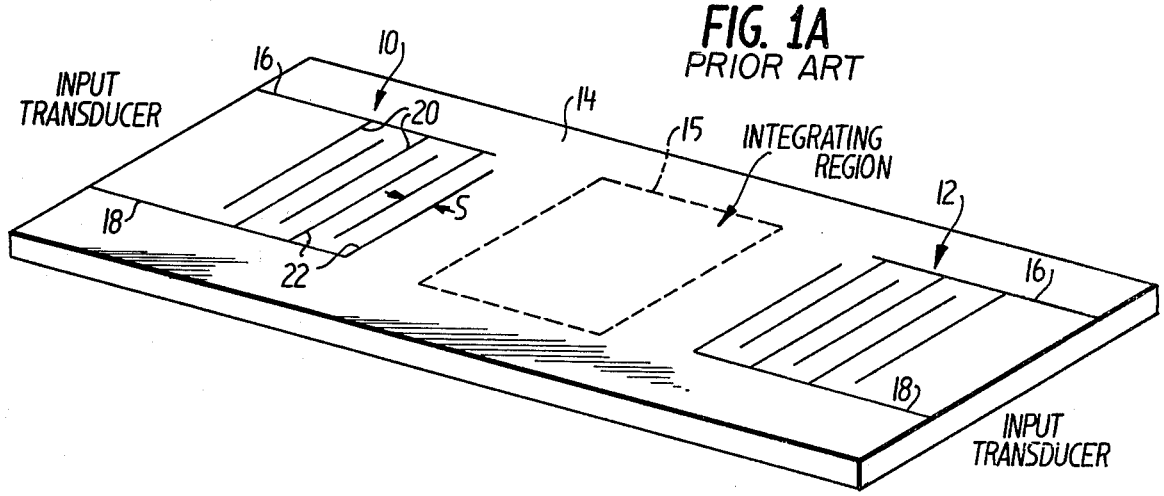
FIG. 1A is a pictorial view of one form of surface wave acoustic cross correlation device using the nonlinearity of an acoustic medium to perform signal multiplication.

FIG. 1A illustrates one form of an acoustic surface wave device for performing cross correlation and related signal convolution functions using the nonlinearity of an acoustic medium to perform signal multiplication. As is illustrated in FIG. 1A, first and second interdigital transducers 10 and 12 may be formed in spaced relation on an elongate, planar substrate 14 of a suitable acoustic wave material to provide spaced input transducers for propagating surface waves toward an integrating region 15 therebetween. Suitable substrate materials and ways of forming the transducers are disclosed in U.S. Pat. No. 3,611,203 to H. W. Cooper and R. A. Moore.

For example, each of the interdigital transducers of the type illustrated in FIG. 1A typically comprises first and second interdigitally arranged electrodes 16 and 18 formed on the surface of the substrate 14. The interdigital electrodes 16 and 18 each include a plurality of spaced, generally parallel, electrically conductive, interconnected members or fingers 20 and 22, respectively, formed in a suitable manner on the surface of the substrate 14. The members or fingers 20 of the interdigital electrode 16 extend intermediate adjacent of the members or fingers 22 of the interdigital electrode 18 as illustrated. The center-to-center spacing S between adjacent fingers 20 and 22, i.e., the interdigital spacing, is typically on the order of $\frac{1}{2}$ an acoustic wavelength $\lambda$ of a surface wave in the acoustic substrate 14.

With the surface wave transducer structure illustrated in FIG. 1A, a surface wave may be generated and propagated along the surface of the substrate 14 by each of the transducers 10 and 12 in a direction generally perpendicular to the individual fingers 20 and 22. Thus, if a signal is applied between the electrodes 16 and 18 of each of the transducers 10 and 12, surface waves will be generated and will propagate along the surface of the substrate 14 in a propagation path passing through the interaction region 15. When the two surface waves simultaneously occupy the integrating region 15, a signal corresponding to some arithmetic combination of the two surface waves, i.e., a convolved function of the two signals, may be provided by an appropriate detector in the integrating region 15.

Figure 1B:
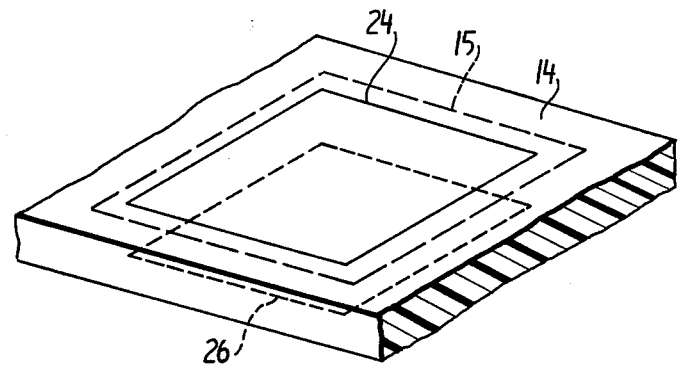
FIGS. 1B and 1C are pictorial views of signal pickup or integrating electrodes which may be utilized in the integrating region of the device of FIG. 1A.
Figure 1C:
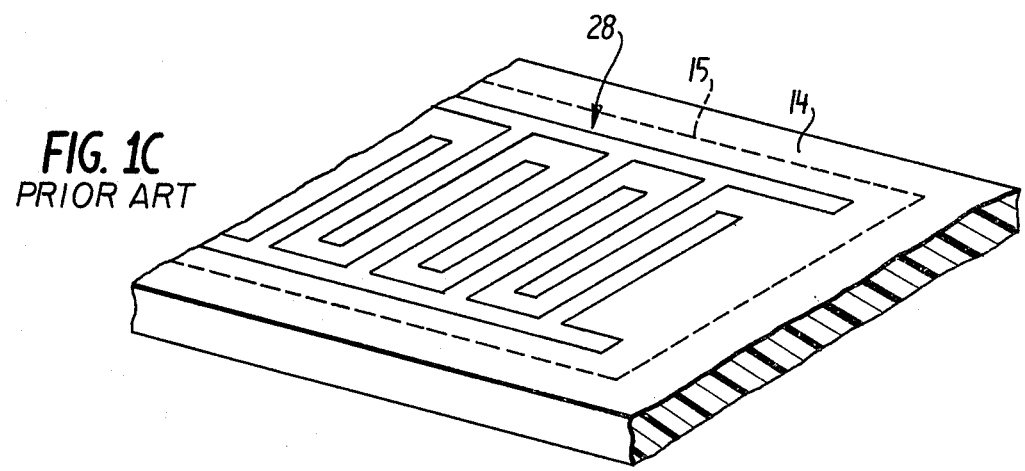

Various forms of detection devices may be utilized in the integrating region 15 to detect and combine the two surface waves occupying the integrating region. For example, in FIG. 1B, one form of integrating electrodes comprising thin, electrically conductive plates 24 and 26 disposed on opposite sides of the substrate 14 within the integrating region 15 may be employed to combine the surface waves where the frequency difference product of two signals ordinarily equal in frequency is to be provided as an output signal. In FIG. 1C, an interdigital arrangement 28 is illustrated in the integrating region 15. The interdigital electrodes 28 may be employed for signal convolution where the frequencies of the input signals differ substantially.

In employing the interdigital electrode arrangement of FIG. 1C, the geometry of the interdigital electrodes 28 may be varied to provide sum or difference functions of the two signals being combined in the integrating region 15. For example, in a cross correlation application, e.g., where a characteristic of one signal is manifested by relating the one signal to another signal having known characteristics, an output signal indicative of either the sum or difference of the two signals being correlated may be desired. The two input signals S1 and S2 may be represented as periodic functions by the equations $S1 = \cos(w_1 t + \phi_1 - \beta_1 z)$ and $S2 = \cos(w_2 t + \phi_2 + \beta_2 z)$. If the input signal frequencies are unequal and the desired output signal is to be a function of the sum frequency of the two input signals, the interdigital spacing of the electrodes employed in the integrating region 15 may correspond to the phase progression difference $(\beta_1 - \beta_2) z$ of the two input signal frequencies. Similarly, if the input signal frequencies are unequal and the desired output signal is to be a function of the difference frequency of the two input signals, the interdigital spacing of the electrode arrangement employed in the integration region 15 may correspond to the phase progression sum $(\beta_1 + \beta_2)z$ of the two input signal frequencies. The reversal of phase velocity corresponding to the sum frequency for the output signal related to the difference frequency of the input signals, and vide versa, occurs because the two input signals are propagating in opposite directions.

As was previously mentioned, the arrangements illustrated in FIG. 1 may fail to be useful in most applications because of the very weak nature of the nonlinear characteristics of the acoustic medium. In accordance with the present invention, the storage characteristics of the acoustic medium are employed for signal convolution functions but the nonlinear characteritics of the acoustic medium are not relied upon for performing signal multiplication. For example, signal convolution of the type involving two signals, e.g., cross correlation, may be performed in accordance with the present invention with an arrangement of the type illustrated in FIG. 2.

Figure 2:
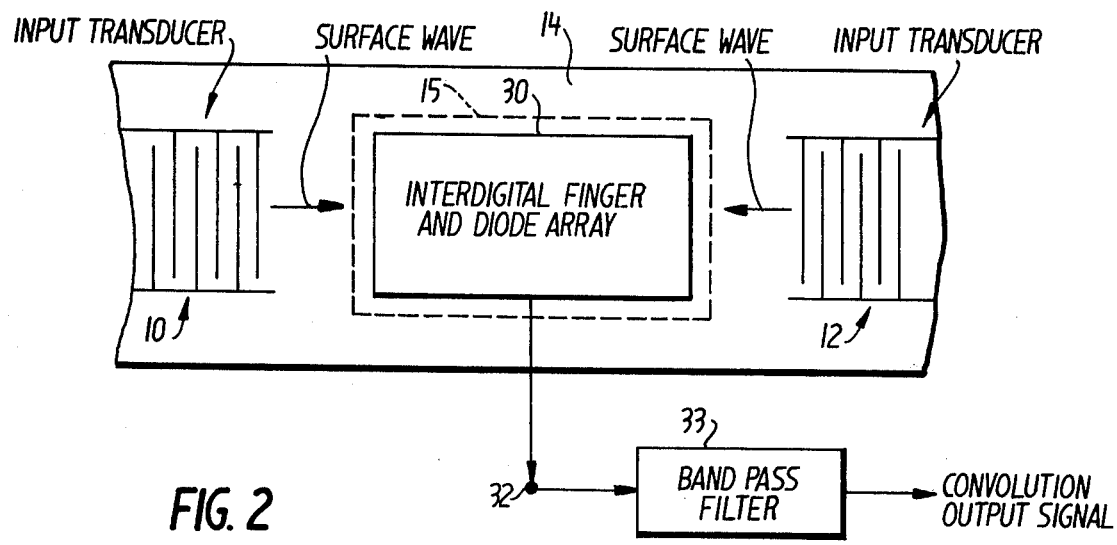
FIG. 2 is a plan view of a surface wave acoustic device for performing convolution in accordance with the present invention employing an interdigital finger and semiconductor diode array in the integrating region of the device.

Referring now to FIG. 2, first and second periodic input signals S1 and S2 may be applied to respective input transducers 10 and 12 formed on a surface of a substrate 14 as was previously described in connection with FIG. 1A. Surface waves having the characteristics of the input signals are thus propagated from the opposite ends of the substrate 14 toward an integrating region 15. In accordance with the invention, an interdigital finger and diode array 30 may be provided in the integration region 15 to detect the surface waves propagating through the integrating region 15 and to provide an output signal related to some combined characteristic of the two input signals S1 and S2. The output signal from the interdigital finger and diode array 30 may be provided at an output terminal 32 and may be filtered and otherwise processed, as required, to provide a convolution output signal. For example, the signal from the interdigital finger and diode array 30 may be applied through a bandpass filter 33 to eliminate undesired transients.

Figure 3:
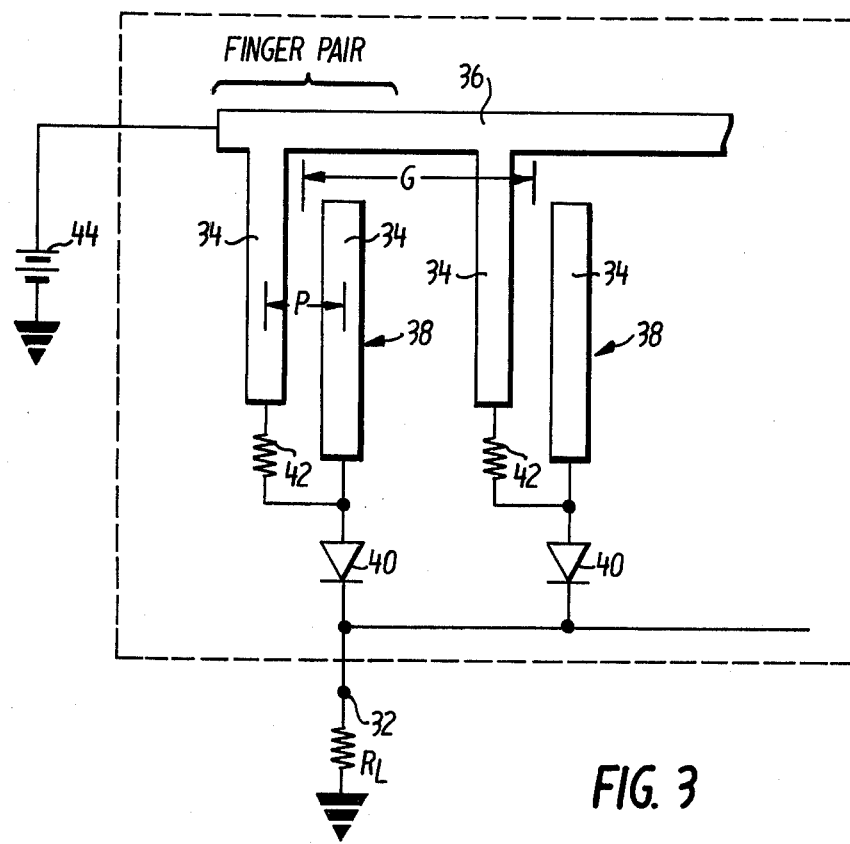
FIG. 3 is a detailed schematic diagram of one embodiment of the interdigital finger and diode array of FIG. 2.

In FIG. 3, the interdigital finger and diode array 30 of FIG. 2 is illustrated schematically in greater detail to facilitate an understanding of the invention. Referring now to FIG. 3, the interdigital finger and diode array 30 may include a plurality of electrically conductive, elongated members or fingers 34 arranged in generally parallel relation and disposed on the substrate 14 generally perpendicular to the direction of propagation of surface waves from the input transducers 10 and 12. Every other one of the fingers 34 may be electrically interconnected through a common, electrically conductive strip 36 and the fingers 34 intermediate the electrically interconnected fingers may be connected to the common output terminal 32, each through an associated diode 40. Two adjacent fingers 34, i.e., one of the electrically interconnected fingers and an immediately adjacent one of the intermediate fingers, together form a finger pair designated by the numeral 38.

Each of the fingers 34 interconnected by the common strip 36 may be electrically connected through a respective resistor 42 to the anode electrode of the diode 40 associated with that finger pair. The bias resistors 42 may be actual resistors, i.e., discrete components, if a highly insulative substrate material is employed. However, actual bias resistors 42 may not be required if the material of the substrate 14 is such that the appropriate bias resistance exists between the individual fingers 14 of the finger pairs 38. Thus, for example, discrete resistors 42 may not be needed where the substrate material is silicon. A film may also provide conduction to supply the bias.

A suitable bias voltage supply 44 may be connected to each of the interconnected fingers 34 in a suitable manner. For example, the bias voltage supply 44 may be connected to the common strip 36 as illustrated. The bias voltage source 44 is electrically poled so as to tend to forward bias the diodes 40 through the path provided by the bias resistors 42 and the external load $R_L$.

The spacing between the individual fingers 34 of each finger pair, i.e., the finger pair spacing, and the spacing between adjacent pairs of fingers, i.e., the group spacing, depends upon the frequency characteristics of the input signals. More specifically, the center-to-center finger spacing P preferably corresponds to the approximate wavelength of the carrier frequencies of the input signals since the sampling finger pair spacing P should be no larger than that which will provide coupling to or sampling of all energy of the signals being correlated over the bandwidth thereof. The group spacing G between adjacent sampling finger pairs 38 is preferably related to the bandwidth of the signals being correlated. For example, for a time bandwidth product of 100, 100 samples and thus 100 finger pairs should be employed for signal correlation and the finger pair group spacing G should be appropriate for the length of the code group or wavelength of the modulation signals being correlated. To maximize the output signal at the output terminal 32, the finger pair group spacing should be such that the phase of the correlated signals at the output terminal 32 is identical from all the sampling finger pairs. While the finger pair and group spacing requirements may possibly be quite stringent where semiconductor multiplication is used as illustrated in FIG. 3, a more stringent spacing requirement is of little consequence since the finger pairs may be photo etched very accurately through conventional masking techniques.

In operation, the acoustic substrate 14 provides the real time signal storage required for signal correlation. The stored signals (surface waves) are coupled by the spaced fingers 34 at the appropriate times (i.e., locations on the substrate) and multiplication is performed by the diodes 40 through the $i \sim V^2$ characteristics thereof, where $i$ is the current flow through each diode and $V$ is the voltage across each diode. Integration is accomplished by summing all diode output signals over the storage period of the substrate 14 on a summing bus represented by the common terminal 32.

Figure 4:
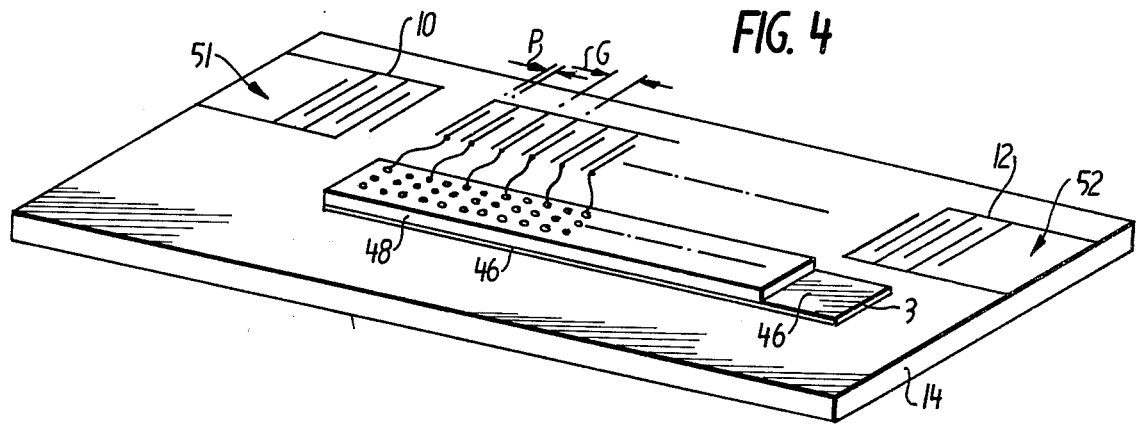
FIG. 4 is a detailed pictorial diagram of one physical embodiment of a cross correlation constructed in accordance with the invention.

One manner in which a signal cross correlator or similar signal convolver may be physically constructed in accordance with the present invention is illustrated in FIG. 4. Referring now to FIG. 4, input transducers 10 and 12 may be formed at each end of an elongated, flat plate of acoustic substrate material 14 on one surface thereof as was previously described. The desired number of finger pairs 38 may be formed along the surface of the substrate 14 within and generally perpendicular to the propagation path of surface waves launched from the transducers 10 and 12. A thin electrically conductive strip 46 may be applied to the surface of the substrate 14 in a suitable manner adjacent the propagation path of the surface waves launched from the transducers 10 and 12 and a diode overlay 48 may be attached in overlying relation to the electrically conductive strip 46.

The diode overlay 48 may comprise a large number of Schottky barrier or other suitable diodes formed in a sheet of semiconductive material. In one known arrangement, the diodes may be approximately 5 microns in diameter and on 10 micron centers. Because of the large number of diodes and the relatively close spacing thereof, one finger of each finger pair 38 may be connected to one diode by using a springy type lead 50 which, because of the number and spacing of the diodes, will tend to find one of the diodes rather than stay between them. The diode overlay 48 is such that the same electrode of each of the diodes, e.g., the cathode electrode of each of the diodes, electrically contacts the conductive strip 46 so that the electrically conductive strip 46 forms a summing bus and provides the common output terminal 32 at one end thereof.

Figure 5:
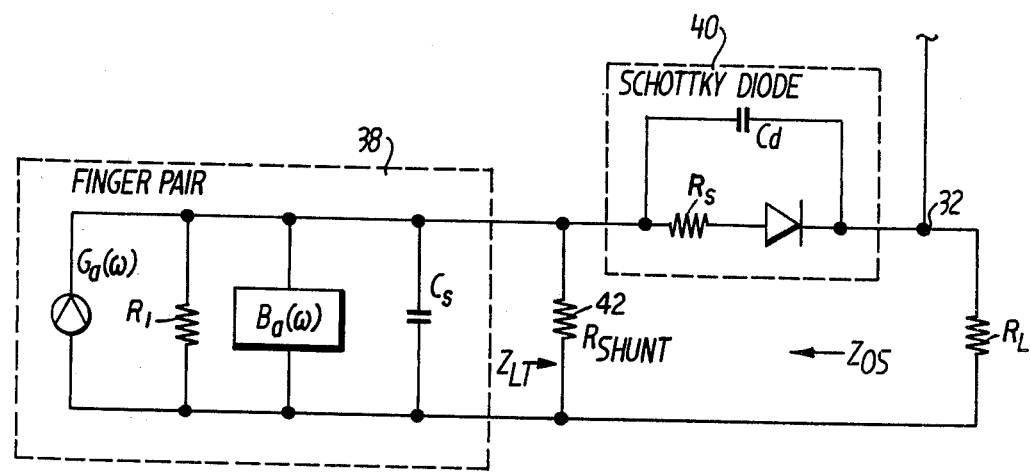
FIG. 5 is an equivalent circuit model of one portion of the interdigital finger and diode array of FIG. 3; and, FIG. 6 is a graph illustrating experimental results obtained in accordance with the general principles of the invention.

An equivalent circuit model of one finger pair 38 of the interdigital fingers and diode array 30 described in connection with FIGS. 2–4 is illustrated in FIG. 5. The equivalent circuit is primarily useful in facilitating designs of interfacing circuitry in that it translates acoustic and diode characteristics into quantifiable electrical parameters. The quantities identified in FIG. 5 are defined as follows for a finger pair:

$G_a(\omega)$ = acoustic radiation admittance
$B_a(\omega)$ = radiation susceptance
$C_s$ = electrical capacitance of single finger pair
$R_{shunt}$ = shunt resistance for diode biasing
$C_d$ = diode capacitance
$R_s$ = diode dynamic resistance at selected operating point
$R_L$ = external load resistance
$R_1$ = passive leakage resistance For particular operating parameters these parameters can be evaluated. By providing values for these parameters, interfacing circuitry can be generated on a design basis. A, for example, set at parameters is as follows:

$R_a = 1/G_a = 39.6K\ \Omega$ radiation residence
$C_s = 0.21$ pf
$B_a = 0$ at resonance (it varies through the usual) S-curve for resonance circuits on deviation from resonance
$R_s = 30.8K\ \Omega$
$R_{shunt} = 50K\ \Omega$ These values have been generated based on the use of a lithium niobate substrate and GaAs diodes.

Figure 6:
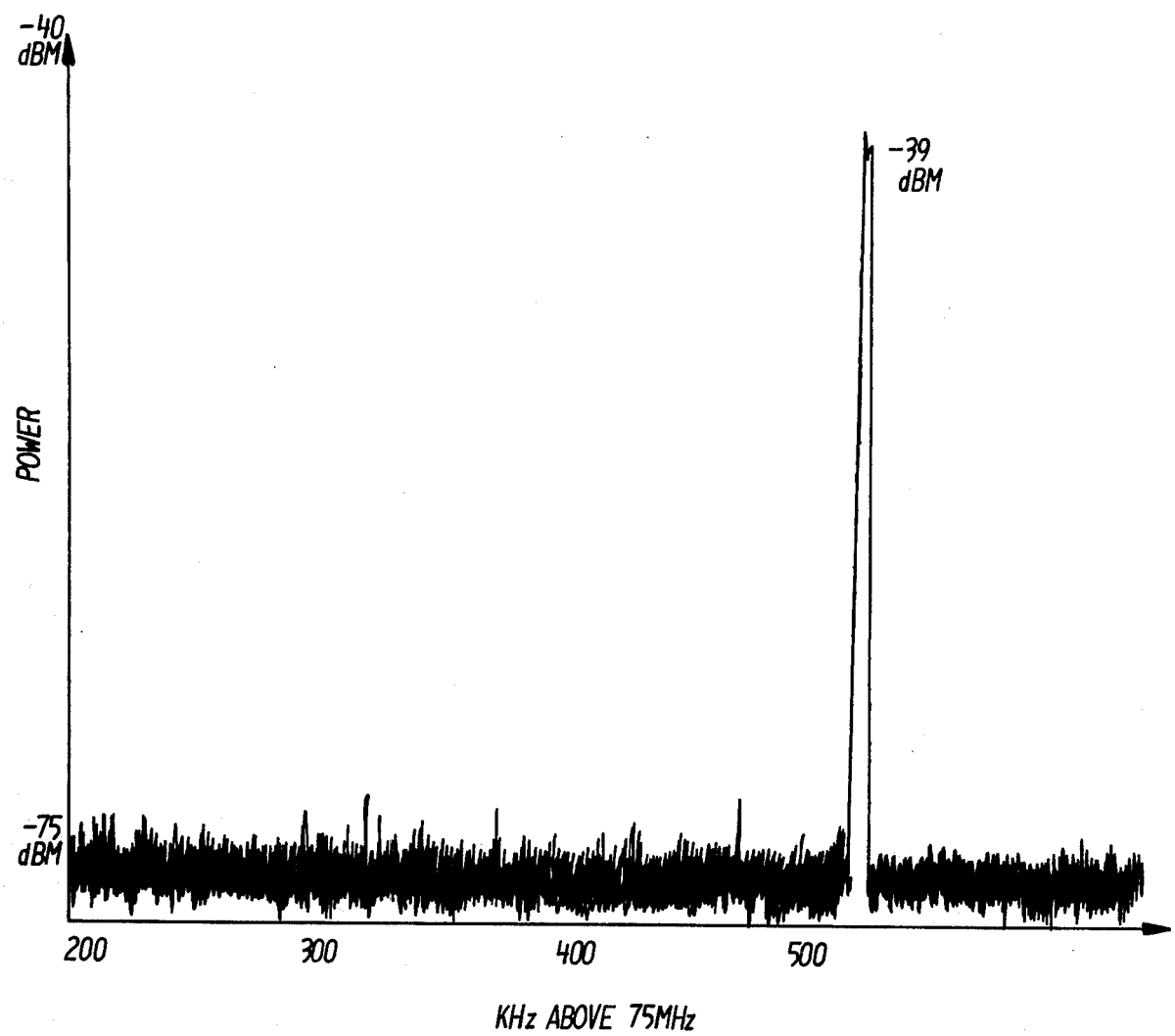

FIG. 6 illustrates the results of an experiment for demonstrating the reduced insertion loss using the combined surface wave and semiconductor technique of the invention for signal correlation. To obtain a measure of insertion loss, an existing surface wave filter was utilized and both input signals were applied to one transducer at one end of the device. A second spaced transfer transducer was appropriately connected to a square law diode device to produce an effective 10 finger pair interdigital finger and diode array, and the output signal from the square law diode device was monitored.

The results obtained for correlation of two 75 MHz signals indicate a total insertion loss, including transduction losses, or 39 dB which is a significant improvement over the insertion losses achieved by workers in the field relying upon the nonlinearity of the acoustic medium for multiplication. It should be noted that these results do not account for the additional benefits obtainable with a multiple pickup correlator of the type described in connection with FIGS. 3 and 4. Thus, it is contemplated that even lower insertion losses than the 39 dB achieved in the aforementioned experiment could be achieved.

It can be seen from the foregoing description that signal convolution, particularly signal correlation, can be achieved in accordance with the present invention at efficiencies several orders of magnitude greater than with any presently available techniques. Attempts at providing signal convolution functions such as correlation with acoustic devices using the nonlinear effect of the acoustic medium have resulted in inefficient laboratory devices which, in practice, provide weak and inefficient signal correlation. The combined acoustic and semiconductor technique described herein would appear to make surface wave correlation a reality by virtue of its much greater efficiency.

The present invention may be embodied in other specific forms without departing from the spirit or essential characteristics thereof. For example, although a Schottky barrier diode overlay is shown as a suitable implementation of the semiconductor portion of the invention, semiconductor films, piezoelectric semiconductor films and piezoresistive films may be appropriate for providing the multiplication function. Moreover, the physical arrangement of the semiconductor multiplication means may be varied so that, for example, the multiplication function may be accomplished directly over the sampling transducer finger pairs through the use of an appropriate film technique with appropriate bussing circuitry and resistive coupling. Such arrangements may be desirable from the standpoint of reducing the overall cost of constructing a combined surface wave acoustic and semiconductor device.

The presently disclosed embodiments of the invention are therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is:

1. Apparatus comprising:
    means carried at spaced locations along a surface of an acoustic substrate for detecting surface waves propagated along said substrate and for providing output signals related to the surface waves detected at said locations,
    semiconductor means operatively connected to said detecting means for arithmetically combining said output signals,
    said detecting means comprises a plurality of generally parallel, spaced, electrically conductive sampling fingers disposed on a surface of said substrate normal to a propagation path of said surface waves,
    said semiconductor means comprises a plurality of semiconductor diodes each having one like electrode operatively connected to at least one of said sampling fingers, the other like electrode of each of said diodes being operatively connected to a common output terminal,
    wherein said semiconductor diodes are Schottky barrier diodes formed through a sheet of substrate material, said common output terminal comprising a sheet of electrically conductive material having one surface disposed in contact with one surface of said sheet of substrate material and in electrical contact with said other like electrode of each of said diodes.

2. Apparatus comprising:
    means carried at spaced locations along a surface of an acoustic substrate for detecting surface waves propagated along said substrate and for providing output signals related to the surface waves detected at said locations,
    semiconductor means operatively connected to said detecting means for arithmetically combining said output signals,
    said semiconductor means comprise a plurality of semiconductor diodes each having one like electrode operatively connected to said detecting means, the other like electrode of each of said diodes being operatively connected to a common output terminal,
    wherein said semiconductor diodes are Schottky barrier diodes formed through a sheet of substrate material, said common output terminal comprising a sheet of electrically conductive material having one surface disposed in contact with one surface of said sheet of substrate material and in electrical contact with said other like electrode of each of said diodes.

3. Apparatus comprising:
    means carried at spaced locations along a surface of an acoustic substrate for detecting surface waves propagated along said substrate and for providing output signals related to the surface waves detected at said locations,
    semiconductor means operatively connected to said detecting means for arithmetically combining said output signals,
    said detecting means comprises a plurality of pairs of generally parallel, spaced, electrically conductive sampling fingers disposed on a surface of the substrate normal to a propagation path of said surface waves propagated along the surface, the spacing between fingers of each pair being related to the frequency of the propagated surface waves and the spacing between adjacent pairs of fingers being related to the bandwidth of the propagated surface waves,
    said semiconductor means comprises a plurality of semiconductor diodes each having one like electrode operatively connected to at least one of said sampling fingers, the other like electrode of each of said diodes being operatively connected to a common output terminal,
    wherein said semiconductor diodes are Schottky barrier diodes formed through a sheet of substrate material, said common output terminal comprising a sheet of electrically conductive material having one surface disposed in contact with one surface of said sheet of substrate material and in electrical contact with said other like electrode of each of said diodes.

4. A signal correlator comprising:

an acoustic substrate;

first and second surface wave transducers at spaced locations on one surface of said substrate and disposed to propagate surface waves along said one surface in a substantially colinear propagation path in response to first and second input signals;

means on said one surface of said substrate intermediate said transducers for detecting surface waves propagated by said transducers along said propagation path, said detecting means being operable to provide a plurality of output signals related to surface waves detected at spaced locations along the surface of said substrate; and, means including a plurality of semiconductive diodes operatively connected to said detecting means for arithmetically combining said plurality of output signals to provide a signal representing the degree of correlation between said first and second input signals, said detecting means comprises a plurality of generally parallel, spaced, electrically conductive sampling fingers disposed on a surface of said substrate normal to a propagation path of said surface waves, each of said semiconductive diodes has one like electrode operatively connected to at last one of said sampling fingers, the other like electrode of each of said diodes being operatively connected to a common output terminal, and said semiconductor diodes are Schottky barrier diodes formed through a sheet of substrate material, said common output terminal comprising a sheet of electrically conductive material having one surface disposed in contact with one surface of said sheet of substrate material and in electrical contact with said other like electrode of each of said diodes.

5. A signal correlator comprising:

an acoustic substrate;

first and second surface wave transducers at spaced locations on one surface of said substrate and disposed to propagate surface waves along said one surface in a substantially colinear propagation path in response to first and second input signals;

means on said one surface of said substrate intermediate said transducers for detecting surface waves propagated by said transducers along said propagation path, said detecting means being operable to provide a plurality of output signals related to surface waves detected at spaced locations along the surface of said substrate; and, means including a plurality of semiconductive diodes operatively connected to said detecting means for arithmetically combining said plurality of output signals to provide a signal representing the degree of correlation between said first and second input signals, each of said semiconductive diodes has one like electrode operatively connected to at least one of said sampling fingers, the other like electrode of each of said diodes being operatively connected to a common output terminal, and said semiconductor diodes are Schottky barrier diodes formed through a sheet of substrate material, said common output terminal comprising a sheet of electrically conductive material having one surface disposed in contact with one surface of said sheet of substrate material and in electrical contact with said other like electrode of each of said diodes.

* * * * *